(12) United States Patent
Tailliet

(10) Patent No.: US 8,654,581 B2
(45) Date of Patent: Feb. 18, 2014

(54) INTEGRATED CIRCUIT COMPRISING A NON-DEDICATED TERMINAL FOR RECEIVING AN ERASE PROGRAM HIGH VOLTAGE

(71) Applicant: STMicroelectronics (Rousset) SAS, Rousset (FR)

(72) Inventor: Francois Tailliet, Fuveau (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 13/706,132

(22) Filed: Dec. 5, 2012

(65) Prior Publication Data

US 2013/0094306 A1 Apr. 18, 2013

Related U.S. Application Data

(62) Division of application No. 12/907,710, filed on Oct. 19, 2010, now Pat. No. 8,351,260.

(30) Foreign Application Priority Data

Oct. 20, 2009 (FR) ...................................... 09 05025
Oct. 20, 2009 (FR) ...................................... 09 05026

(51) Int. Cl.
*G11C 11/34* (2006.01)

(52) U.S. Cl.
USPC .............. 365/185.07; 365/185.1; 365/185.22; 365/185.25

(58) Field of Classification Search
USPC ........ 365/185.01, 185.1, 185.22, 185.25, 204
See application file for complete search history.

(56) References Cited

U.S. PATENT DOCUMENTS

| | | |
|---|---|---|
| 5,276,646 A | 1/1994 | Kim et al. |
| 5,559,956 A | 9/1996 | Sukegawa |
| 2003/0169624 A1 | 9/2003 | Fujioka |
| 2005/0169021 A1* | 8/2005 | Itoh ................................ 363/60 |
| 2008/0151676 A1 | 6/2008 | Mizutani |

* cited by examiner

*Primary Examiner* — Jason Lappas
(74) *Attorney, Agent, or Firm* — Seed IP Law Group PLLC

(57) ABSTRACT

The disclosure relates to an integrated circuit electrically powered by a supply voltage and comprising a memory electrically erasable and/or programmable by means of a second voltage greater than the supply voltage. The integrated circuit comprises means for receiving the second voltage by the intermediary of a reception terminal of the supply voltage or by the intermediary of a reception or emission terminal of a data or clock signal. Applicable in particular to electronic tags comprising a reduced number of interconnection terminals.

18 Claims, 7 Drawing Sheets

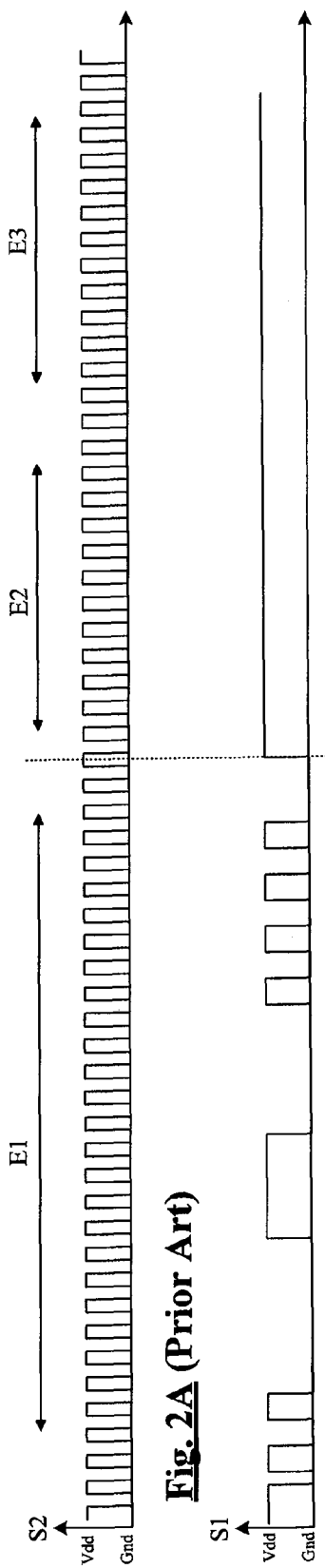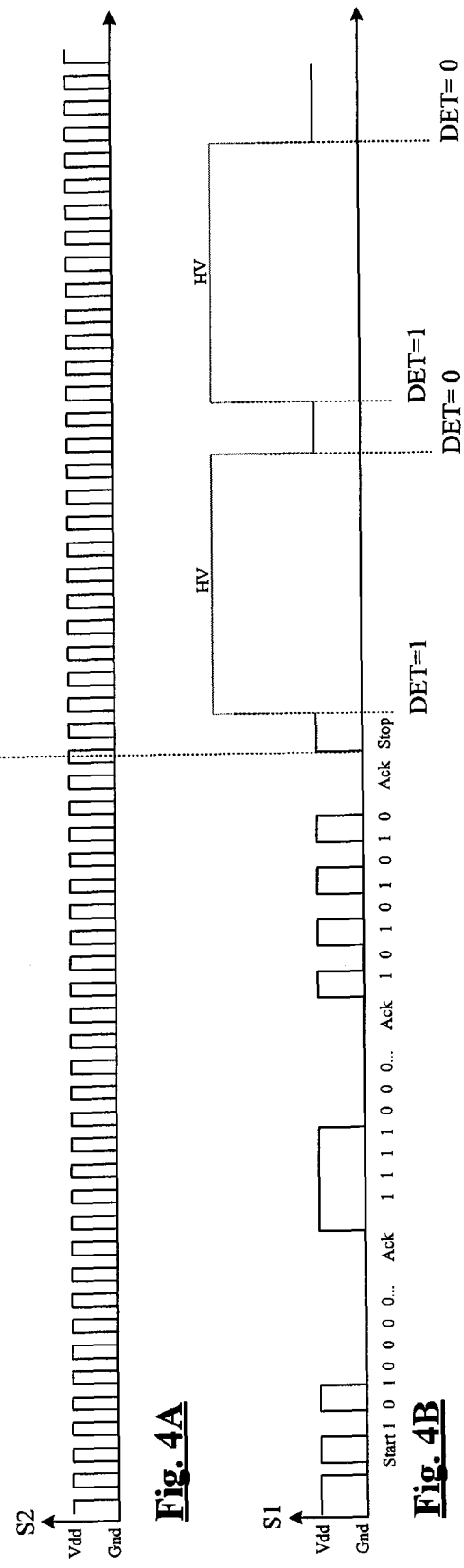

INTEGRATED CIRCUIT COMPRISING A NON-DEDICATED TERMINAL FOR RECEIVING AN ERASE PROGRAM HIGH VOLTAGE

BACKGROUND

1. Technical Field

The present disclosure relates to an integrated memory circuit comprising a memory erasable and/or programmable electrically by means of a second voltage greater than the supply voltage.

The present disclosure also relates to a device for supplying an erase program high voltage to an integrated circuit.

2. Description of the Related Art

The integrated memory circuit market is currently experiencing a demand for programmable integrated circuits at very low prices, small sizes, and having a minimal number of interconnection terminals (contact pads). Such integrated circuits generally offer a limited memory size, sometimes only several tens or hundreds of bits. They may be reprogrammable by the user, or be programmed once and for all in the factory. The memory is generally of the electrically erasable and programmable (EEPROM) type.

Indeed, numerous applications exist for such integrated memory circuits, such as electronic tags containing a serial number programmed in the factory, calibration circuits with various components (sensors, light-emitting diodes LEDs, . . . ) containing calibration data programmed in the factory and possibly reprogrammable during use, etc.

To write data in their memories, such integrated circuits use an erase program voltage with a high value, conventionally between 10V and 15V, clearly larger than their supply voltage, which is on the order of 3V to 5V.

During the 1980's, this erase program high voltage was supplied to integrated circuits by means of a dedicated connection terminal. This connection terminal was later removed and replaced by an embedded charge pump capable of supplying the erase program voltage from the supply voltage of the integrated circuit. At this time however, it is no longer conceivable to return to the previous solution because the addition of such a connection terminal is contrary to the current specifications for a reduction of the number of integrated circuit connection terminals.

The architecture of a conventional integrated circuit of the type considered here is shown schematically in FIG. 1. The integrated circuit IC1 comprises an EEPROM type memory MEM1, a control circuit CCT1, a charge pump CP, a circuit PPCT, a ground terminal P0 (GND), a terminal P1 receiving a supply voltage Vdd, a connection terminal P2 to receive and/or emit a data or clock signal S1, and a connection terminal P3 to receive or emit a data or clock signal S2.

The control circuit CCT1 is configured to execute memory read or write commands received by the intermediary of terminals P2, P3. As an example, FIGS. 2A, 2B show the forms of the signals S1, S2 during the reception of a write command via a bus I2C. The signal S1 is in this case the data signal "SDA" ("Serial DAta") provided by the protocol I2C and the signal S2 is the clock signal "SCL" ("Serial CLock") provided by this protocol.

The command is received during a phase E1 by the intermediary of signal S1 that carries the bits at 1 and at 0. The circuit CCT1 then starts an erase phase E2 of a memory target zone designated by the command, then a program phase E3 of memory cells in the erased target zone. To this end, the circuit CCT1 activates the charge pump CP and the circuit PPCT. The charge pump CP supplies a high voltage HV to the circuit PPCT. This latter shapes this high voltage HV and supplies to the memory MEM1 an erase program high voltage Vpp with a regulated amplitude and a controlled duration, for example a voltage ramp followed by a voltage plateau with a value close to the voltage HV. The ramp-plateau signal may be supplied two times to the memory, first during the phase E1 and then during the phase E2.

The provision of an embedded charge pump however is detrimental in terms of price and of silicon surface area occupied by the integrated circuit. A charge pump includes several capacitors on the order of several pico farads pF each, occupying a non-negligible silicon surface area. In addition, the regulation of the voltage HV by means of the circuit PPCT to obtain the voltage Vpp relies on a stable reference voltage and a specific circuitry that also occupies a non-negligible silicon surface area.

Thus, it may be desirable to simplify the structure of an integrated memory circuit employing an erase program high voltage to write data in its memory.

Independently of this, it may also be desired to provide a device to supply an erase program high voltage to one or more integrated circuits.

BRIEF SUMMARY

Some embodiments of the disclosure relate to an integrated memory circuit electrically powered by a supply voltage and comprising a memory erasable and/or programmable electrically by means of a second voltage greater than the supply voltage, comprising means for receiving the second voltage by the intermediary of a reception terminal of the supply voltage or by the intermediary of a reception or emission terminal of a data or clock signal.

According to one embodiment, the integrated circuit comprises means for receiving the second voltage by the intermediary of a reception terminal of the supply voltage, and a voltage limiter regulator circuit having an input linked to the reception terminal of the supply voltage and supplying the supply voltage when the second voltage is present on the reception terminal.

According to one embodiment, the integrated circuit comprises means for receiving the second voltage by the intermediary of a reception or emission terminal of a data signal, and a decoupling circuit having an input linked to the reception or emission terminal of the data signal and an output linked to a supply node of the integrated circuit destined to receive the second voltage, the decoupling circuit being configured to prevent fluctuations of the data signal from reaching the supply node, and to transfer the second voltage to the supply node once it is present on the reception or emission terminal of the data signal.

According to one embodiment, the integrated circuit comprises means for receiving the second voltage by the intermediary of reception or emission terminal of a clock signal, and a rectifier circuit having an input linked to the reception terminal of the clock signal and an output linked to a supply node of the integrated circuit, to supply the second voltage to the supply node once it is present on the reception terminal of the clock signal.

According to one embodiment, the integrated circuit also comprises means for receiving the supply voltage by the intermediary of a reception terminal of a data or clock signal.

According to one embodiment, the integrated circuit is configured to apply the second voltage to the memory without controlling the duration nor the shape of the second voltage.

According to one embodiment, the integrated circuit comprises a level shifter circuit comprising a first input receiving the supply voltage, a second input receiving the second voltage, and an output supplying the second voltage to the memory when it is present on the second input, otherwise supplying the supply voltage.

According to one embodiment, the integrated circuit comprises a control circuit configured to execute memory erase and/or program commands, and a detection circuit of the presence of the second voltage, supplying a detection signal to the control circuit for the synchronization of the control circuit relative to the appearance of the second voltage.

Some embodiments of the disclosure also relate to an electronic system comprising at least one integrated memory circuit electrically powered by a supply voltage and comprising a memory erasable and/or programmable electrically by means of a second voltage greater than the supply voltage; a data bus connected to the integrated memory circuit; and means for applying the second voltage to the integrated circuit by the intermediary of a wire of the data bus that is connected to a reception terminal of the supply voltage of the integrated circuit or to a reception or emission terminal of a data or clock signal of the integrated circuit.

According to one embodiment, the means for applying the second voltage comprises a voltage management device connected to the said wire of the data bus and arranged to monitor the communications upon the data bus and detect that a write command has been applied to the integrated circuit, and apply the second voltage on the said wire of the data bus when the write command has been detected.

Some embodiments of the disclosure relate to a method for writing data in an integrated memory circuit electrically powered by a supply voltage and comprising a memory erasable and/or programmable electrically by means of a second voltage greater than the supply voltage, and comprising the steps of applying a write command to the integrated circuit, then supplying the second voltage to the integrated circuit by the intermediary of a reception terminal of the supply voltage or by the intermediary of a reception or emission terminal of a data or clock signal of the integrated circuit.

According to one embodiment, the method comprises the steps of connecting the integrated circuit to a data bus and connecting a wire of the data bus to a reception terminal of the supply voltage or to a reception or emission terminal of a data or clock signal of the integrated circuit; applying the write command to the integrated circuit by the intermediary of the data bus; and supplying the second voltage to the integrated circuit by the intermediary of the said wire of the data bus.

According to one embodiment, the method comprises the steps of applying the write command to the integrated circuit by means of a master circuit connected to the data bus; detecting the application of the write command by means of a voltage management device connected to the data bus, distinct from the master circuit and arranged to monitor the data traveling on the bus; and applying the second voltage to the said wire of the data bus by means of the voltage management device.

BRIEF DESCRIPTION OF THE SEVERAL VIEWS OF THE DRAWINGS

These different aspects of the present disclosure will be better understood in light of the following description of embodiments of the disclosure, in relation with but not limited to the following figures, in which:

FIGS. 2A, 2B previously described show data and clock signals received by the integrated circuit in relation with the reception of a data write command, FIGS. 4A, 4B show data and clock signals, as well as a high voltage received by the integrated circuit of FIG. 3 in relation with the reception and the execution of a data write command.

DETAILED DESCRIPTION

Figure 1:
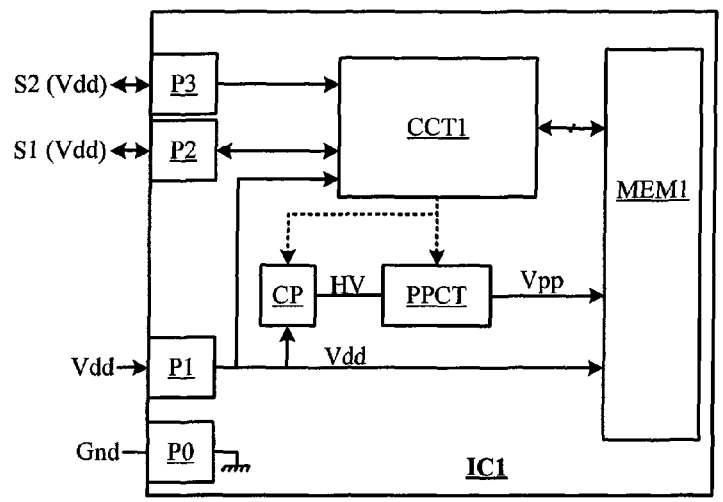
FIG. 1 previously described shows a conventional integrated memory circuit.
Figure 3:
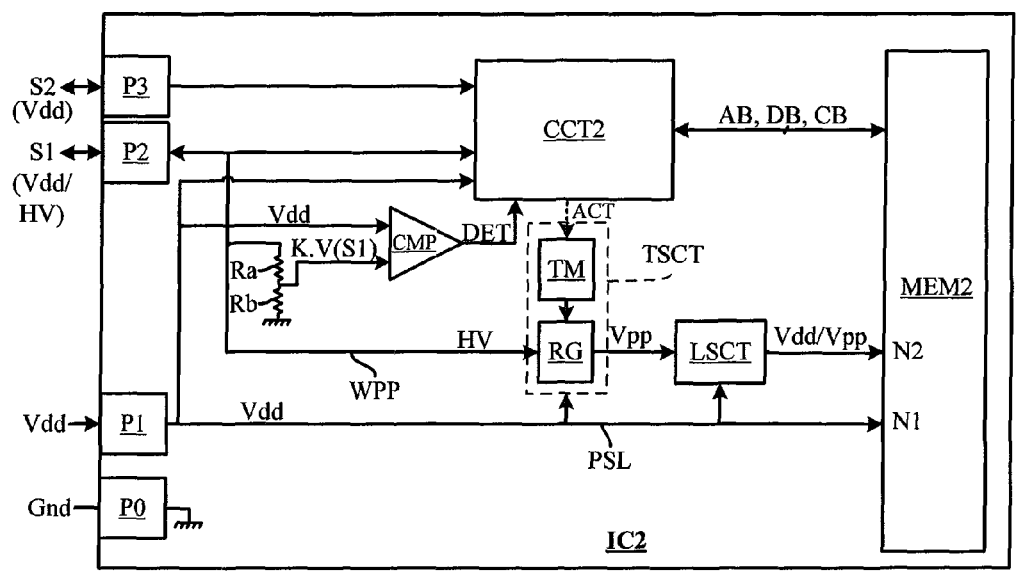
FIG. 3 shows an embodiment of an integrated memory circuit according to the disclosure.

FIG. 3 shows a first embodiment of an integrated memory circuit IC2 according to the disclosure. The integrated circuit IC2 comprises connection terminals P0, P1, P2, P3, a memory MEM2, a control circuit CCT2, a timer-sequencer circuit TSCT, and a level shifter circuit LSCT. The terminal P0 is a ground connection terminal (GND). The terminal P1 is a supply terminal linked to an internal supply line PSL of the integrated circuit, and receives a supply voltage Vdd. The terminals P2, P3 are communication terminals allowing the integrated circuit to receive or to emit data or clock signals S1(Vdd), S2(Vdd) of which, in normal operation conditions, the maximum voltage generally does not exceed the voltage Vdd.

The timer-sequencer circuit TSCT is provided to receive a high voltage HV in a rough state and to transform it into a memory MEM2 erase program voltage Vpp, with controlled shape and duration. The circuit TSCT comprises for example a ramp generator circuit RG and a timer TM. The circuit RG supplies a voltage comprising a voltage ramp followed by a voltage plateau Vpp with a regulated value. The timer TM deactivates the circuit RG and sets the voltage Vpp back to zero when a specified time lapse has finished.

The level shifter circuit LSCT comprises a first input connected to the circuit TSCT output and receiving the voltage Vpp, a second input connected to the supply line PSL and receiving the voltage Vdd, and an output supplying the voltage Vpp or the voltage Vdd in the absence of the voltage Vpp.

The memory MEM2 is for example an electrically erasable and programmable EEPROM memory. It has a supply node N1 provided to receive the voltage Vdd and a supply node N2 provided to receive the voltage Vpp or the voltage Vdd in the absence of the voltage Vpp. The node N1 is connected to the supply line PSL, whereas the node N2 is connected to the output of the level shifter circuit LSCT.

The circuit CCT2 ensures the management of a communication protocol for the exchange of data via a data bus (not shown) connected to terminals P2, P3. It also ensures the decoding and the execution of memory MEM read and write commands received by the intermediary of the terminals P2, P3. The circuit CCT2 may be in the form of a hard-wired state machine, a microprogrammed circuit, a microprocessor, etc. It will be supposed in the following that the circuit CCT2 is configured to receive the memory read or write commands via a bus I2C connected to the terminals P2, P3.

According to the disclosure, the integrated circuit IC2 does not have charge pumps or other means allowing it to generate the high voltage HV from the supply voltage Vdd, and receives the high voltage HV by the intermediary of the terminal P2. Thus, a conductor WPP links the circuit TSCT input to the terminal P2.

A write operation of data in the memory MEM2 comprises a first step of sending a write command to the integrated circuit IC2 then a step of applying the voltage HV to the terminal P2. The circuit CCT2 waits for the voltage HV to appear on the terminal P2 before executing the command. Various methods may be provided to synchronize the execution of the write command with the appearance of the voltage HV.

According to a first method, the voltage HV is applied to the terminal P2 after a specified amount of time following the application of the command. The circuit CCT2 comprises an internal timer that indicates to it that the specified amount of time has finished and that it may now activate the circuit TSCT. The timer is for example a counter that counts the clock signal S2 cycles received on the terminal P3. Such a method of synchronization by counting presents certain constraints, notably requiring a corresponding programming of the external device that applies the voltage HV. Indeed, in order to supply the voltage HV at the right time, the external device must itself count the number of clock cycles that it emits.

A second method provides a detection of the voltage HV by the integrated circuit and is implemented in the embodiment shown in FIG. 3. The integrated circuit IC2 comprises a voltage HV detector, here a comparator CMP. The comparator CMP has a first input receiving the voltage Vdd and a second input linked to the terminal P2 by the intermediary of the midpoint of a voltage divider bridge. The voltage divider bridge comprises for example two resistors Ra, Rb in series connected between the terminal P2 and ground. The second input of the comparator thereby receives a fraction K*V(S1) of the voltage V(S1) of the signal 51 present on the terminal P2, K being less than 1 and for example equal to 0.6. The comparator CMP output supplies to the circuit CCT2 a detection signal DET that is for example at "1" (Vdd) when the voltage HV is present on the terminal P2, and equal to 0 when the voltage Vdd is present on the terminal P2. More particularly, when the voltage V(S1) varies between 0 and Vdd, the second input of the comparator CMP receives a voltage that varies between 0 and 0.6*Vdd, whereas the first input of the comparator receives the voltage Vdd. In this case the detection signal DET is equal to 0. When the signal S1 voltage becomes equal to HV, the second input of the comparator CMP receives a voltage equal to 0.6*HV, greater than the voltage Vdd, and the signal DET goes to 1 (Vdd).

The FIGS. 4A, 4B show the signals S1, S2 at the reception and the execution of the write command. As indicated previously, it is assumed that the command is received via a bus I2C, the signals S1, S2 respectively forming a data signal (SDA) and a clock signal (SCL) within the meaning of the I2C protocol. The following may be distinguished: a reception phase E1 of the write command, an erase phase E2 of a target zone, and a program phase E3 of the erased target zone memory cells.

Phase E1:

The signal S1 comprises communication protocol bits "Start", "Ack" ("Acknowledgement") and "Stop", and bits forming the write command itself. The write command comprises an operation code, a part of the address of the target zone to write (for example a column address), the data to write, then the rest of the address of the target zone (for example a row address). The data, column address, and row address are applied to the memory MEM2 by the circuit CCT2, for example by programming latches, a column decoder, and a row decoder of the memory, as will be described later. When the phase E1 is finished and the complete write command has been received, the signal S1 no longer oscillates and rests for example equal to 1 (Vdd), whereas the clock signal S2 continues to be applied to the integrated circuit during the following phases E2, E3.

Phase E2:
- the signal S1 is brought to the high voltage HV;
- the detection signal DET goes to 1, informing the circuit CCT2 of the presence of the voltage HV;
- the circuit CCT2 applies the activation command ACT to the circuit TSCT;
- the circuit TSCT supplies the voltage Vpp in the form of a ramp followed by a voltage plateau with controlled amplitude, then sets the voltage Vpp back to zero after a specified time lapse;
- the signal S1 is restored to the voltage Vdd;
- the detection signal DET goes to 0, informing the circuit CCT2 of the end of phase E2.

Phase E3:
- the signal S1 is brought to the high voltage HV;
- the detection signal DET goes to 1;
- the circuit CCT2 applies a programming command to the memory MEM2 and applies an activation command ACT to the circuit TSCT;
- the circuit TSCT supplies the voltage Vpp, then resets it to zero after a specified time lapse;
- the signal S1 is restored to the voltage Vdd;
- the detection signal DET goes to 0.

It is evident that the duration of the application of the voltage HV during the phases E2, E3 must be at least equal to, and preferably greater than, the amount of time required for the erasing and the programming of the target zone. Additionally, the fact that the voltage on the terminal P2 goes back to Vdd between the two phases E2, E3 is optional and merely allows for the resynchronization of the integrated circuit relative to the voltage HV before the programming phase E3 starts. Alternatively, a single peak of voltage HV may be applied to the integrated circuit during the phases E2, E3.

Figure 5:
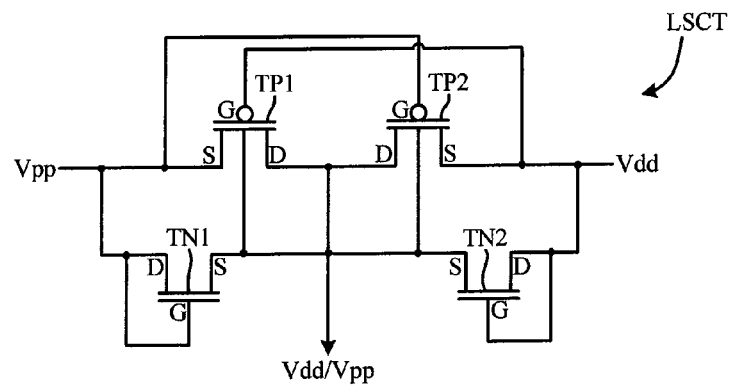
FIG. 5 is the electrical diagram of an embodiment of a level shifter circuit shown in block form in FIG. 3.

A simple implementation example of the level shifter circuit LSCT is shown in FIG. 5. It comprises two PMOS type transistors TP1, TP2 in series and two NMOS type transistors TN1, TN2 in series. Each group of transistors in series is arranged in parallel between the input receiving the voltage Vdd and the input receiving the voltage Vpp of the circuit LSCT. The transistors TN1, TN2 are mounted as diodes. The midpoint of the group of transistors TP1, TP2 is connected to the midpoint of the group of transistors TN1, TN2 and forms the output of the level shifter circuit. The source of the transistor TP1 is linked to the first input of the circuit LSCT, whereas its gate is linked to the second input of the circuit LSCT. The source of the transistor TP2 is linked to the second input of the circuit LSCT, whereas its gate is linked to the first input of the circuit LSCT. The circuit LSCT functions as a diode voltage multiplexor without a voltage drop thanks to the transistors TP1, TP2, and supplies on its output the voltage that is the highest, that is to say the voltage Vpp or the voltage Vdd when the voltage Vpp is absent, the output of the circuit TSCT being assumed here to maintain the voltage Vpp at 0 in the absence of the voltage HV so that the transistor TP2 is conducting.

Figure 6:
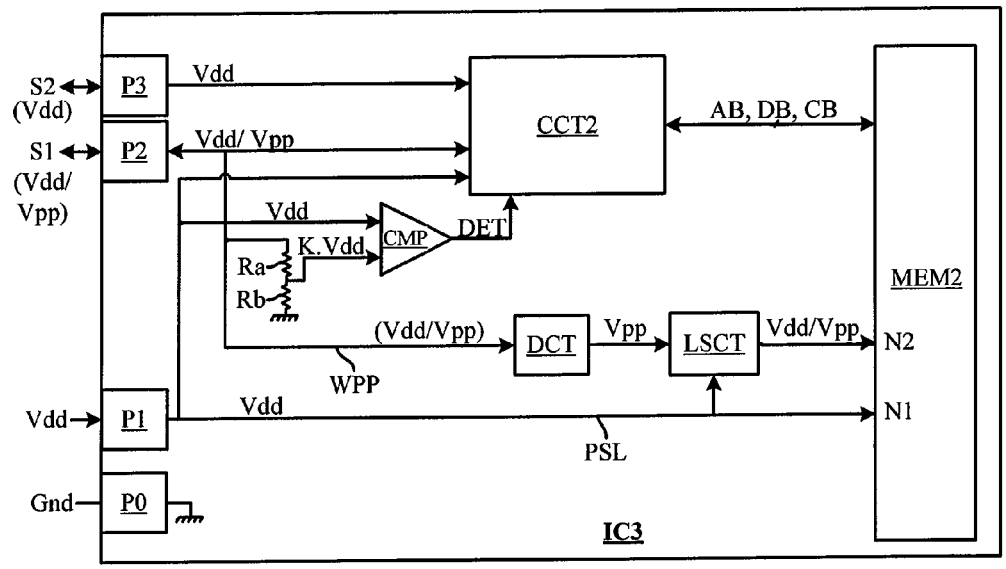
FIG. 6 shows another embodiment of an integrated memory circuit according to the disclosure.

A second embodiment of an integrated memory circuit IC3 according to the disclosure is shown in FIG. 6. The integrated circuit differs from the circuit IC2 in that it does not comprise the timer-sequencer circuit TSCT. The high voltage input of the level shifter circuit LSCT is therefore directly linked to the connection terminal P2 of the circuit IC3, or is linked to the terminal P2 by the intermediary of a decoupling circuit DCT, which will be described later. The inputs of the comparator CMP receive, as previously, the voltage Vdd and a fraction K of the voltage V(S1) of the signal S1, supplied by the divider bridge Ra, Rb.

Figure 7:
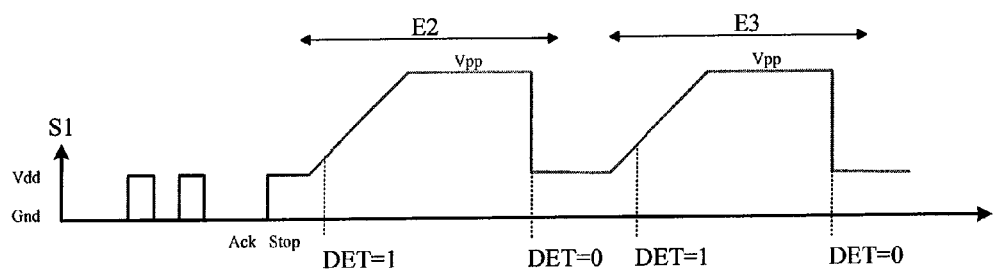
FIG. 7 shows a data signal and a high voltage received by the integrated circuit of FIG. 6 in relation with the reception and execution of a write command.

As shown in FIG. 7, the high voltage applied to the terminal P2 during the phases E2, E3 is preferably the conditioned voltage Vpp, having for example the form of a ramp followed by a regulated voltage plateau, rather than a high voltage HV in the rough state in the form of a voltage peak as that applied to the circuit IC2 (FIG. 4B). However, the application of the voltage HV without a ramp and without regulation could be considered for certain applications, depending upon the memory cell robustness and on the desired memory MEM2 lifetime. In addition, as the duration of the voltage Vpp is no longer controlled by the integrated circuit, the duration of the application of the voltage Vpp must also be controlled by the external device that supplies this voltage. As previously, the synchronization of the phases E2, E3 with the voltage Vpp is done by means of the comparator CMP used as a voltage Vpp detector, but could also be done by counting the clock cycles.

Figure 8:
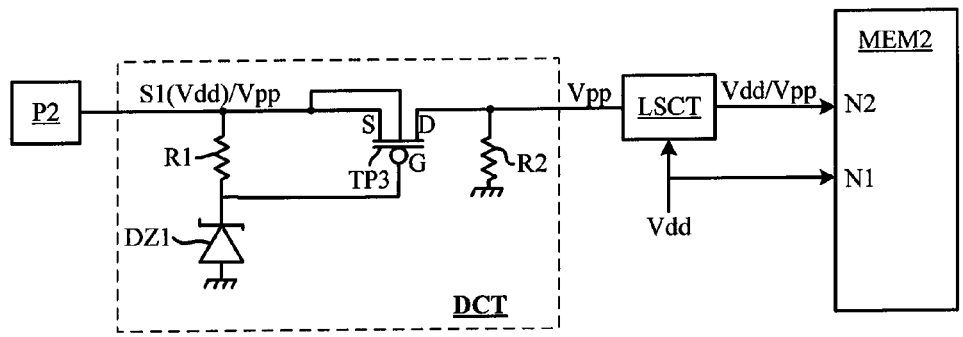
FIG. 8 is the electrical diagram of an embodiment of a decoupling circuit shown in block form in FIG. 6.

FIG. 8 shows a simple and very small size embodiment of the decoupling circuit DCT. The circuit DCT isolates the high voltage input of the level shifter circuit LSCT, and consequently the memory supply node N2, from the noise caused by the signal S1 fluctuations when not in the erase phase E2 and the program phase E3. It comprises for example a Zener diode DZ1, a resistor R1, a PMOS transistor TP3, and a resistor R2. The diode DZ1 and the resistor R1 are arranged in series between the terminal P2 and ground. The transistor TP3 has its source connected to the terminal P2, its drain connected to the high voltage input of the circuit LSCT and its gate connected between the resistor R1 and the diode DZ1. The resistor R2 is arranged between the drain of the transistor TP3 and ground.

As long as the voltage on the terminal P2 is less than the Zener voltage, for example 5V, the diode DZ1 is blocked; the gate of the transistor TP3 is maintained by the resistor R1 at the same potential as its source S, whereas the drain D of the transistor is pulled by the resistor R2 to ground. The transistor TP3 is blocked. When the voltage Vpp appears on the terminal P2 and becomes greater than the Zener voltage, the diode DZ1 becomes conducting, and a current flows through the resistor R1. When the voltage Vpp becomes equal to the sum of the Zener voltage and the threshold voltage of the transistor TP3, the voltage at the terminals of the resistor R1 is therefore equal to the threshold voltage of the transistor TP3, which becomes conducting. The voltage Vpp is applied to the supply node N2 of the memory by the intermediary of the circuit LSCT.

Figure 9:
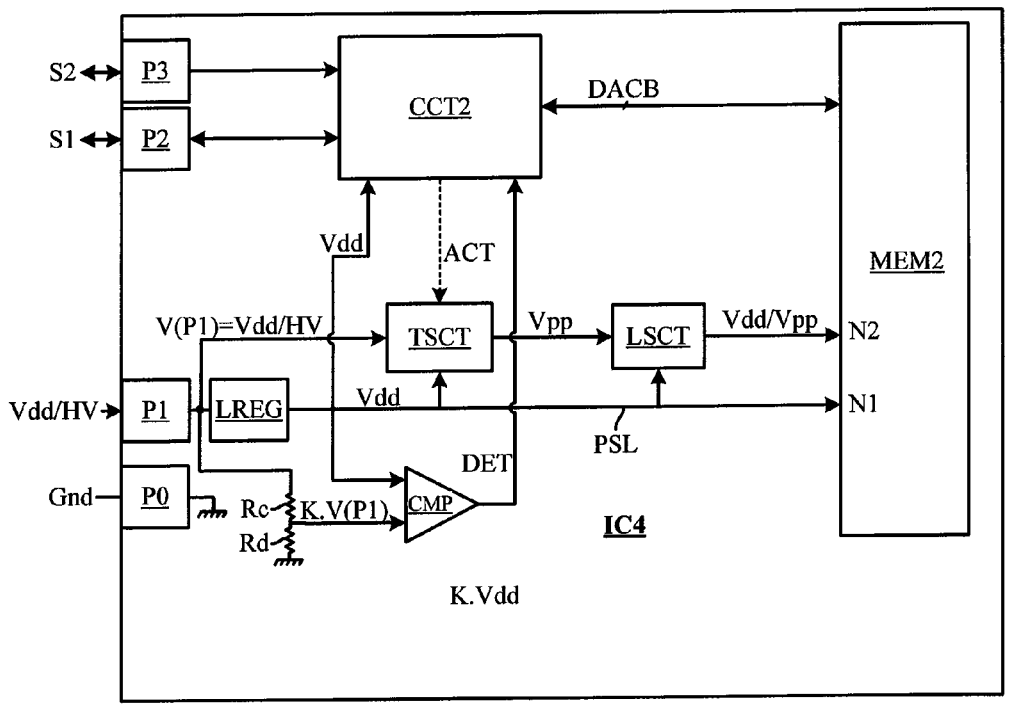
FIG. 9 shows another embodiment of an integrated memory circuit according to the disclosure.

FIG. 9 shows an integrated memory circuit IC4 that differs from the previously described circuit IC2 in that the supply terminal P1 is here used to supply the voltage HV to the integrated circuit. Thus, the voltage V(P1) applied to the terminal P1 is equal to Vdd when not in the erase or program phases and is equal to the voltage HV during these phases.

The input of the timer-sequencer circuit TSCT is connected to the terminal P1 instead of being connected to the terminal P2. The integrated circuit IC4 also comprises a voltage limiter regulator circuit LREG arranged between the terminal P1 and the internal supply line PSL that carries the voltage Vdd. As previously, the memory supply node N2 is connected to the output of the timer-sequencer circuit TSCT by the intermediary of the level shifter circuit LSCT and the supply node N1 of the memory is connected to the line PSL.

The comparator CMP supplying the detection signal DET has here its first input connected to the output of the voltage limiter regulator LREG. Its second input is linked to the terminal P1 by the intermediary of the midpoint of a voltage divider bridge comprising for example two resistors Rc, Rd in series, arranged between the terminal P1 and ground. The second input of the comparator CMP thus receives a voltage K*V(P1) that may be equal to K*Vdd or to K*HV, K being less than 1 and for example equal to 0.6. When V(P1)=Vdd, the voltage limiter regulator LREG supplies to the line PSL a voltage equal to or close to the voltage Vdd (give or take the voltage drop in the voltage limiter). In this case, the voltage K*Vdd is less than the voltage Vdd and the signal DET is equal to 0.

Once a data write command has been applied to the integrated circuit IC4 by the intermediary of the terminal P2, the voltage V(P1) is brought to the high voltage HV to allow the control circuit CCT2 to perform the erase phase E2 and the program phase E3. Once V(P1) goes from Vdd to HV, the voltage limiter regulator LREG continues to supply a voltage equal or close to Vdd. The voltage K*HV becomes greater than the voltage Vdd and the signal DET goes to 1 (Vdd). The control circuit CCT2 starts the timer-sequencer circuit TSCT in the previously described manner.

In an alternative implementation inspired by the second embodiment described previously, the integrated circuit IC4 does not comprise the circuit TSCT and receives the voltage Vpp on the terminal P1, the shape and duration of which are controlled by the external device that supplies this voltage.

Figure 10:
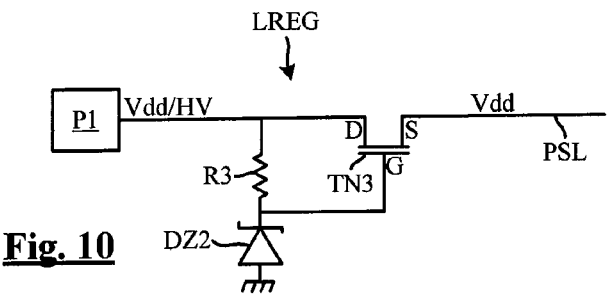
FIG. 10 is the electrical diagram of an embodiment of a voltage regulator shown in block form in FIG. 9.

FIG. 10 shows a simple and very small size embodiment of the voltage limiter regulator LREG, which comprises a Zener diode DZ2, a resistor R3, and an NMOS type transistor TN3. The diode DZ2 and the resistor R3 are arranged in series between the regulator input (terminal P1) and ground. The drain D of the transistor TN3 is connected to the regulator input, its source S forms the regulator output and is connected to the internal supply line PSL, its gate G is connected between the resistor R3 and the diode DZ2.

As long as the voltage on the terminal P1 is equal to Vdd and is less than a Zener voltage VZ, for example 5V, the gate G of the transistor TN3 is maintained by the resistor R3 at the same potential as its drain D. The transistor TN3 functions as a diode and transfers the voltage Vdd onto its source, with a voltage drop equal to its threshold voltage Vt. When the voltage applied to the terminal P1 increases and becomes greater than the voltage Vdd, the diode DZ2 becomes conducting. The voltage of the gate G of the transistor is equal to the Zener voltage and the voltage supplied by the source of the transistor is equal to VZ-Vt. Consequently, the regulator supplies to the integrated circuit a supply voltage equal to Vdd-Vt when the voltage Vdd is applied to the terminal P1 or else a voltage equal to VZ-Vt when the voltage Vpp is applied to the terminal P1. If the voltage Vdd is close to the voltage VZ, the supply voltage Vdd-Vt on the line PSL remains more or less constant. It is evident that the skilled person may provide various other regulator structures, notably a structure without a voltage drop.

An integrated memory circuit according to the disclosure is susceptible of various other embodiments.

In one embodiment, the high voltage HV or Vpp is applied to the integrated circuit in a pulsed form by the intermediary of the clock terminal P2, by bringing the peak value of the clock signal to the voltage HV or Vpp. In this case, the integrated circuit comprises a voltage limiter circuit or a comparator to supply a clock signal having a maximum voltage that is equal or close to the voltage Vdd when the voltage Vpp is applied to the terminal P2. It also comprises a rectifier circuit (for example a diode) followed by a filter circuit (for example a capacitor) to transform the clock signal into a continuous voltage HV or Vpp. Alternatively, the high voltage HV or Vpp may be superimposed on the clock signal. In this case, the integrated circuit may comprise a high-pass circuit or a comparator to extract the clock signal from the signal received by the terminal P2, and a rectifier and filter circuit to extract the voltage HV or Vpp from this signal.

This embodiment is equally applicable to an integrated circuit having a connection terminal receiving a data signal including a clock signal, notably an integrated circuit only having two connection terminals, a ground terminal and a data and clock signal terminal. Such an integrated circuit receives both the voltage Vdd and the voltage HV or Vpp by the intermediary of the data and clock signal reception terminal. A data and clock signal filter and smoothing circuit extracts a first voltage that may be the voltage Vdd when not in the erase or program phases E2, E3, or the voltage Vpp during the phases E2, E3. During the phases E2, E3, a limiter circuit connected to the filter and smoothing circuit output receives the voltage HV or Vpp and supplies the voltage Vdd to the integrated circuit.

The high voltage HV or Vpp may equally be applied to the terminal P2 without the clock signal S2 during the phases E2, E3 if the integrated circuit comprises an internal clock signal generator or simply an internal time base determining the erase time and the program time.

In one embodiment, the integrated circuit does not have a means for conditioning the high voltage Vpp, such as the ramp generator or the plateau voltage regulator, but comprises a timer that allows it to control the duration of the application of the voltage Vpp to the memory MEM2. In this case, the external device that supplies the voltage Vpp ensures the conditioning and the regulation of this voltage.

Additionally, the disclosure is equally applicable to integrated circuits comprising an electrically programmable but not erasable memory, or to integrated circuits comprising an electrically erasable but not programmable memory.

An integrated circuit according to the disclosure may also comprise a greater number of communication terminals. For example, the integrated circuit may be designed to be connected to a bus SPI ("Serial Peripheral Interface Bus") comprising four connection terminals: "SCLK" (Clock, signal generated by an external master circuit), "MOSI" ("Master Output, Slave Input", signals generated by the master circuit), "MISO" ("Master Input, Slave Output", signals generated by the integrated circuit) and "SS" ("Slave Select", signals generated by the master circuit). In this case, the voltage Vpp may be supplied to the integrated circuit by the intermediary of its data emission terminal or by the intermediary of its data reception terminal.

Moreover, even though in the preceding the example has been considered of an integrated memory circuit receiving write commands and executing such commands by performing an erase cycle followed by a program cycle, the present disclosure may apply to an integrated circuit configured to receive distinct erase and program commands. Such commands may be: erase commands of data, of pages, or of sectors of the memory, even an erase command of the entire memory; or program commands of data in blocks, in pages, or in sectors of the memory. It may also consist of write commands that are not accompanied by data. For example, a specific command may be provided to request that the integrated circuit code a series of alternating 0's and 1's in the memory during a test phase. Such a command does not require the supply of data 0 and 1 to the integrated circuit.

In a general manner, and in order to simplify the language, the term "write command" therefore designates in the present application any type of command, the execution of which requires the supply to the memory of a voltage greater than the supply voltage of the integrated circuit.

In the preceding, embodiments have been described of an integrated circuit receiving a high external voltage HV or Vpp by the intermediary of a non-dedicated connection terminal during phases of writing data in its memory. Such an integrated circuit may be designed to be used as an electronic tag containing data pre-saved at the time of its commissioning. The process of writing data before the commissioning is called "personalization". This process is generally implemented by means of a master circuit that is linked to a plurality of integrated memory circuits by the intermediary of a data bus, for example a bus I2C, and that personalizes the integrated circuits one after the other.

In order to supply the high voltage HV or Vpp to the integrated circuits during the personalization process, it may be provided to modify the master circuit structure so that it itself supplies this voltage. Nevertheless, it may also be desired not to modify the master circuit structure. Notably, it may be desired to personalize the integrated circuits according to the disclosure by means of an existing personalization system, equipped with a master circuit that is not designed to supply such a voltage to the integrated circuits.

Figure 11:
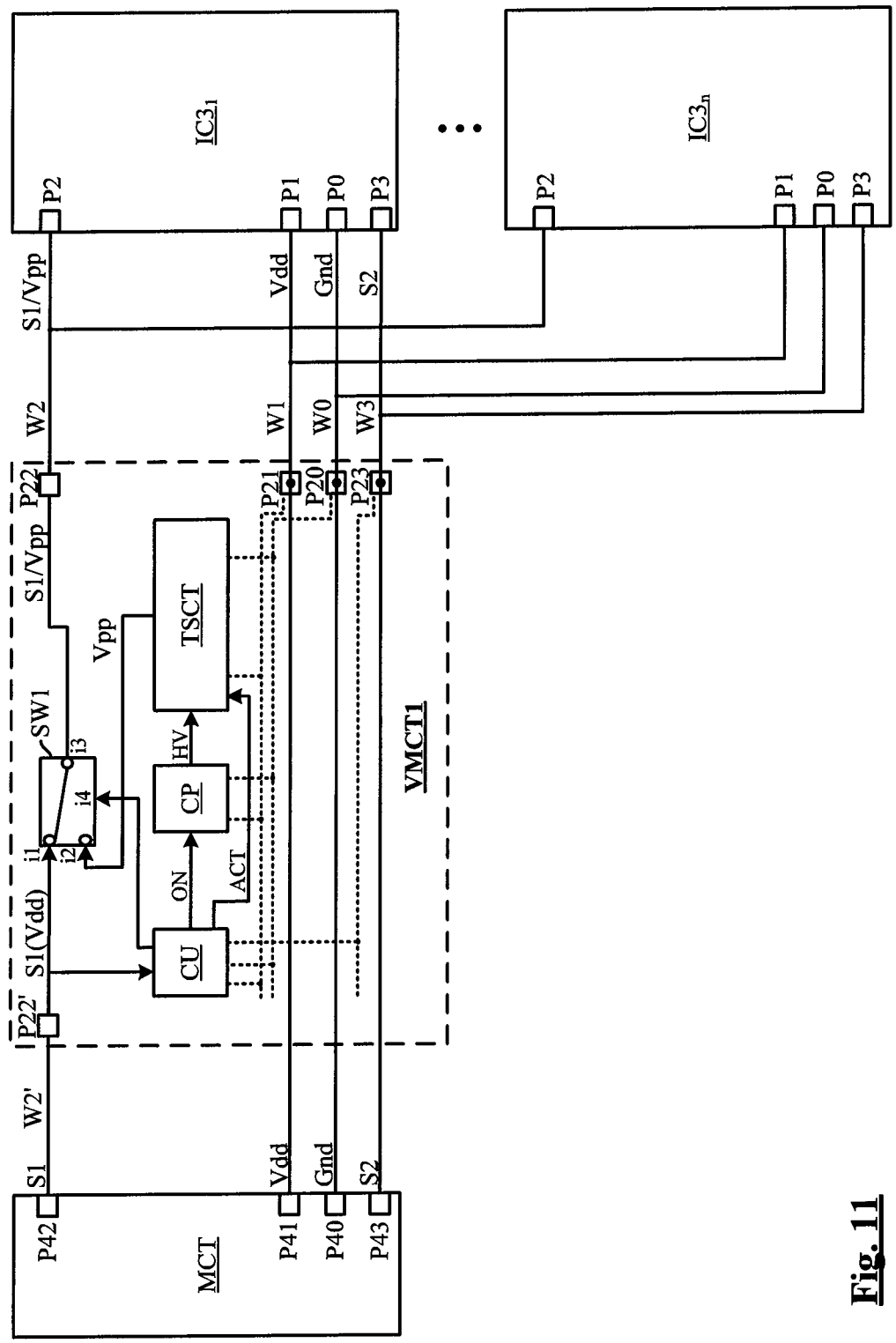
FIG. 11 shows an electronic system comprising integrated circuits according to the disclosure and a voltage management device according to the disclosure.

An embodiment of the disclosure relates to a voltage management device VMCT1, the structure of which is shown in FIG. 11. The device VMCT1 is dedicated to the supply of the voltage HV or Vpp. It may be in the form of an integrated circuit on a semiconductor microchip or in the form of a discrete-component circuit on a printed circuit board. The device VMCT1 is connected to a data bus linking a master circuit MCT to integrated memory circuits $IC3_1, \ldots IC3n$ according to the disclosure.

The data bus comprises wires W0, W1, W2, W2', W3 (the term "wire" covers any type of conductor that may be used to link the master circuit to the integrated circuits, including a probe card if the personalization is done on a silicon wafer, before the dicing of the integrated circuits). The device VMCT1 comprises connection terminals P20, P21, P22, P22', P23. The master circuit comprises connection terminals P40, P41, P42, P43. Each integrated circuit comprises the terminals P0 (ground), P1 (Vdd), P2 (signal S1), and P3 (signal S2) previously described. The wire W0 links the terminal P0 of each integrated circuit IC3 to the terminal P40. The wire W1 links the terminal P1 (Vdd) of each integrated circuit IC3 to the terminal P41. The wire W3 links the terminal P3 of each integrated circuit IC3 to the terminal P43. The terminal P20 of the device VMCT1 is connected to the wire W0, the terminal P21 is connected to the wire W1, and the terminal P23 is connected to the wire W3. Finally, the terminal P2 of each integrated circuit IC3 is connected to the terminal P22 of the device VMCT1. The terminal P22' of the device VMCT1 is connected to the terminal P42 of the master circuit MCT. The device VMCT1 is thus interposed between the integrated circuits and the master circuit on the data wire W2, W2' carrying the signal S1.

The device VMCT1 is designed to supply a voltage Vpp of controlled shape, amplitude, and duration. It comprises here a charge pump CP to supply the voltage HV and a timer-sequencer circuit TSCT of the previously-described type to supply the voltage Vpp from the voltage HV.

The device VMCT1 also comprises a central monitoring unit CU, of the hard wired sequencer or microprocessor type, and a switch SW1. The switch SW1 comprises a terminal i1 connected to the terminal P22', a terminal i2 connected to the output of the circuit TSCT, and a terminal i3 connected to the terminal P22. The switch also comprises a control input i4 controlled by the central unit, by means of which the central unit may set the switch in a transparent state where the terminal i1 is linked to the terminal i3, or in a non-transparent state where the terminal i2 is linked to the terminal i3. In the transparent state, the terminal P22 is linked to the terminal P22' and the signal S1 can travel between the master circuit MCT and the integrated circuits IC3. In the non-transparent state, the terminal P22 is linked to the output of the circuit TSCT and the voltage Vpp is applied to the terminal P2 of each integrated circuit IC3.

The central monitoring unit CU is configured to initially set the switch SW1 in the transparent state, monitor the data carried by the signal S1 and traveling upon the wire W2, W2', and to detect the emission of a write command by the master circuit MCT, without necessarily determining for which integrated circuit IC3 it is destined. To this end, the central monitoring unit CU monitors and analyzes the data signals traveling upon the wire W2, W2', identifies the command formats according to the protocol by which these data were formatted, and identify the write commands. As indicated previously, the term "write command" includes any type of command, the execution of which requires the supply of the voltage HV or Vpp to the integrated circuits.

Once a complete write command has been detected, the central unit applies an activation signal "ON" to the charge pump CP, applies the activation command ACT to the circuit TSCT, then sets the switch SW1 in the non-transparent state. The circuit TSCT thus supplies the voltage Vpp to the integrated circuits $IC3_1, \ldots IC3_n$. The integrated circuit IC3 targeted by the command uses this voltage to execute the command.

In an alternative implementation, not shown, of the device VMCT1, the voltage Vpp is applied to the supply terminals P1 of the integrated circuits by the intermediary of the wire W1. The integrated circuits are thus in conformance with the third embodiment shown in FIG. 9. In this case, the device VMCT1 comprises a supplementary terminal P21' connected to the terminal P41 of the master circuit by the intermediary of a wire W1' (not shown). The terminal P21 is connected to the terminals P1 of the integrated circuits by the intermediary of the wire W1, and the terminals i3, i1 of the switch SW1 are connected respectively to the terminals P21 and P21'. The terminal P22' and the wire W2' are not present and the terminal P42 of the circuit MCT is linked to the terminals P2 of the integrated circuits IC3 by means of the wire W2. The terminal P22 is connected to the wire W2 to allow the device VMCT1 to monitor the commands traveling upon the bus.

In yet another alternative implementation, not shown, of the voltage management device, the voltage Vpp is applied by the intermediary of the wire W3 to the terminals P3 (clock signal S2) of the integrated circuits. In this case, these latter are made, in conformance with the previously-described embodiment, to extract, from the overcharged clock signal supplied to them, a clock signal with a voltage close to Vdd and the voltage Vpp.

In yet another alternative implementation, not shown, the device VMCT1 is made of discrete components on an interconnection support and receives from the exterior a voltage between 15 and 20V forming the voltage HV, generated for example by means of the alternating voltage of the sector. The generation of the voltage ramp Vpp is done by means of operational amplifiers or by discrete transistors. The supply voltage "Vdd" of the device VMCT1 may however be independent of that of the circuit MCT. In this case, the connection to the terminals P1 of the integrated circuits to receive the voltage Vdd is not necessary, with the exception of an embodiment where the integrated circuits receive the voltage HV by the intermediary of the terminal P1.

Additionally, the switch SW1 may be replaced by any other means for injecting the voltage Vpp on the data bus, such as a voltage follower amplifier connected between the terminals P22' and P22. The follower amplifier is powered by the voltage Vdd when the device VMCT1 is in the transparent state and is powered by the voltage Vpp during the phases E2, E3. Inverting gates powered by the voltage Vdd when the device VMCT1 is in the transparent state and powered by the voltage Vpp during the phases E2, E3 could also be used. This embodiment is possible if the signal S1 is maintained at 1 (Vdd) by the master circuit MCT during the phases E2, E3.

Figure 12:
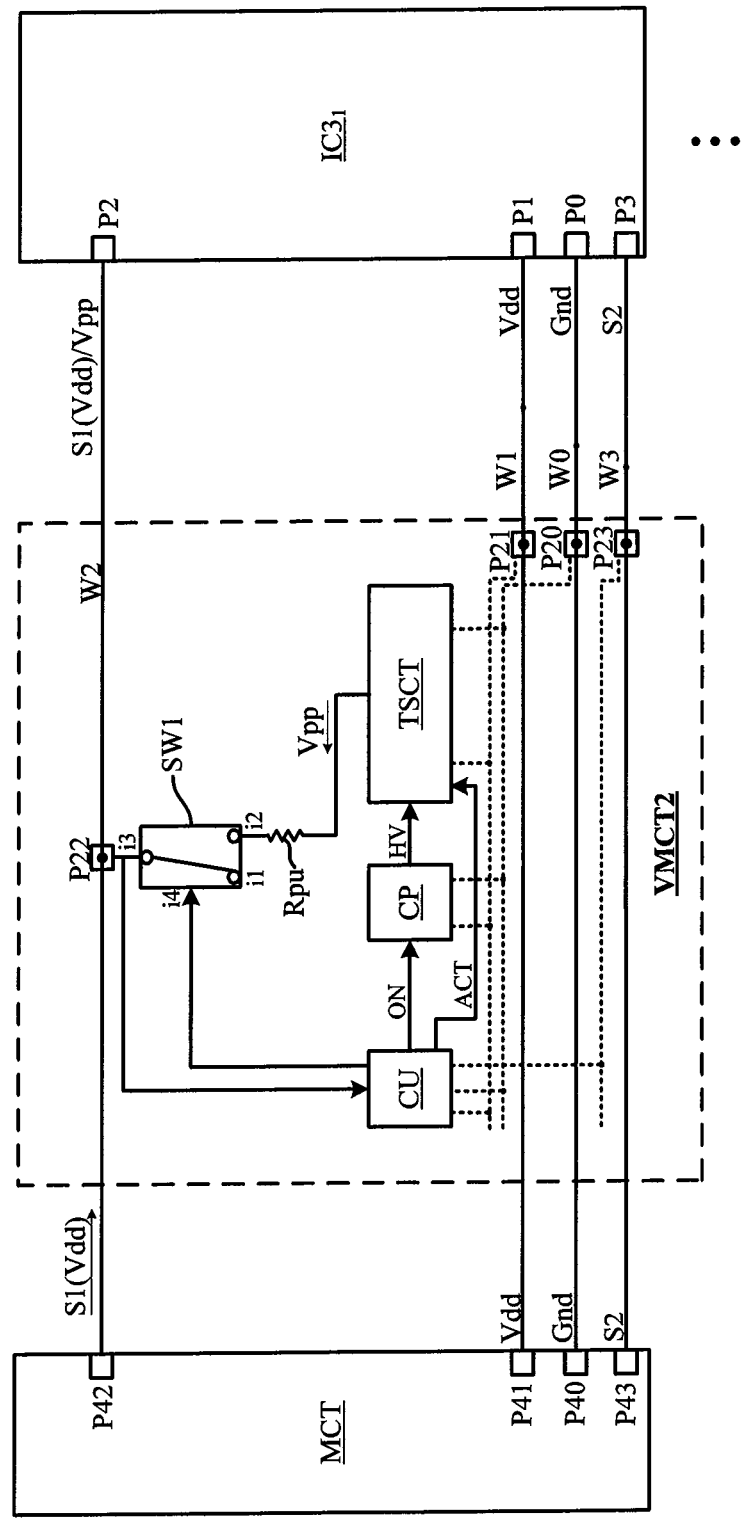
FIG. 12 shows an alternate embodiment of the electronic system shown in FIG. 11.

Another variation VMCT2 of the voltage management device according to the disclosure is shown in FIG. 12. The device VMCT2 differs from the device VMCT1 in that it does not comprise the terminal P22'. The terminal P22 is linked at the same time, by the intermediary of the wire W2, to the terminal P42 of the master circuit MCT and to the terminals P2 of the integrated circuits IC3. The terminal P22 is also linked to the terminal i3 of the switch SW1. The input i1 of the switch is not connected to anything and the input i2 is linked to the output of the circuit TSCT by the intermediary of a "pull-up" resistor Rpu. Thus, when the central unit CU sets the switch SW1 in the non-transparent state (terminal i2 connected to the terminal i3), the voltage Vpp is applied on the data wire W2. This embodiment is for example applicable to a master circuit MCT that sets the signal S1 at high impedance during the phases E2, E3.

The skilled person will note that the extra costs created by the provision of the device VMCT1 or VMCT2 are compensated for by the cost reduction of each integrated memory circuit to which it supplies the voltage HV or Vpp, because a single voltage management device allows for the cost reduction of thousands of integrated circuits that it allows to be personalized. To get a better idea, an integrated circuit having 128 memory bits, of the electronic tag type, equipped with an interface circuit I2C and made with 0.5 micron technology, currently can be implemented on a semiconductor microchip with a surface area of approximately 0.6 mm$^2$. An integrated memory circuit according to the disclosure, having a similar memory but without means for generating the high voltage HV or Vpp and also made with 0.5 micron technology, may be integrated upon a semiconductor microchip with a surface area of approximately 0.35 mm$^2$.

The skilled person will also note that the device VMCT1 or VMCT2 can be used with conventional integrated circuits comprising a contact terminal specifically dedicated to the reception of the voltage HV or Vpp. Thus, the provision of the device VMCT1 or VMCT2 is an aspect of the disclosure which is independent of the features of the integrated circuits to which the voltage HV or Vpp is supplied, as far as the terminal receiving this voltage is concerned.

The skilled person will finally note that the system shown in FIG. 11 or 12, comprising the integrated circuits IC3$_1$, ... IC3$n$, the master circuit MCT, and the device VMCT1, may be something other than a personalization system of integrated circuits before their conditioning. These integrated circuits IC3 may be for example embedded electronic tags in ink cartridges and the master circuit MCT may be a printer processor provided to manage such ink cartridges.

Figure 13:
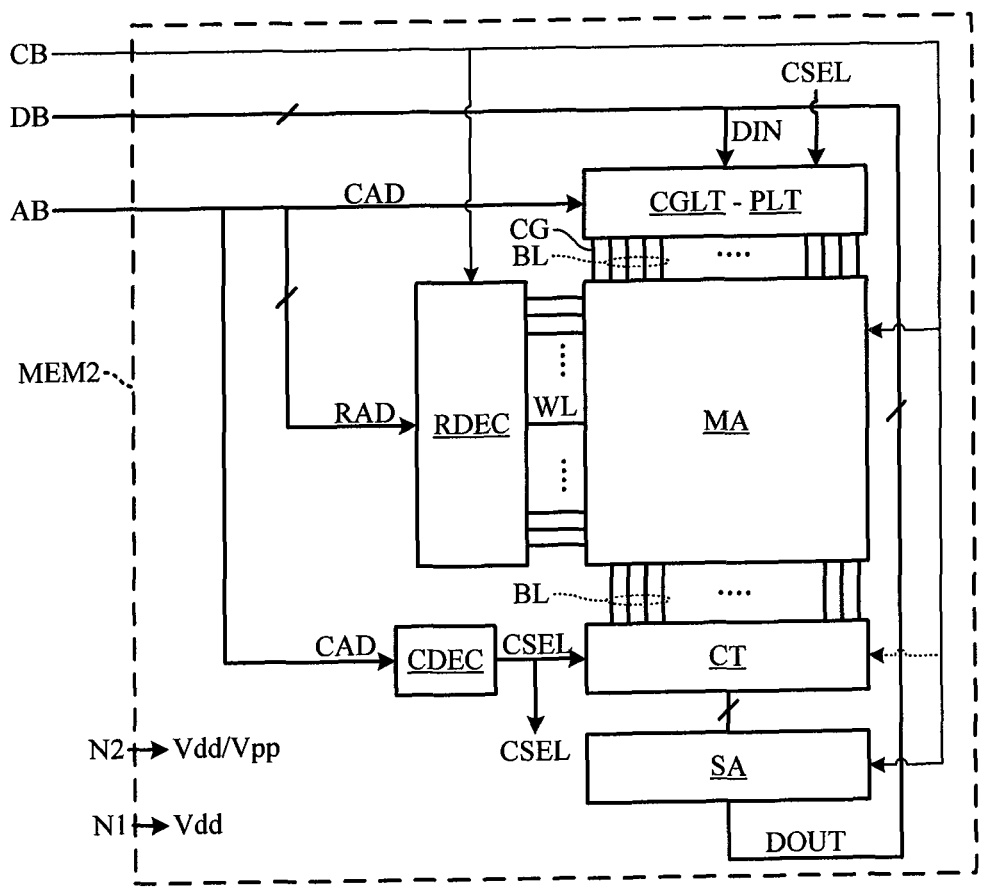
FIG. 13 shows an embodiment of a memory shown in block form in FIGS. 3, 6, and 9.

FIG. 13 shows an embodiment of the memory MEM2. The memory comprises a memory array MA, word lines WL, bit lines BL, a row decoder RDEC, a column decoder CDEC, control gate latches CGLT, program latches PLT, a group CT of column selection transistors, and a group of sense amplifiers SA.

Figure 14:
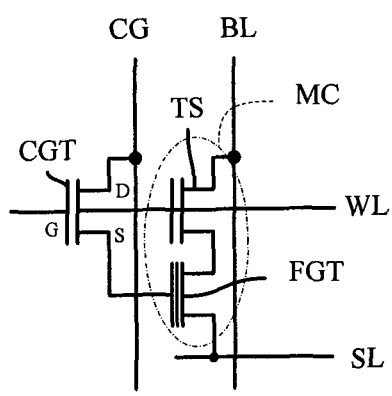
FIG. 14 shows an embodiment of a memory cell of the memory of FIG. 13.

FIG. 14 shows an embodiment of a memory cell MC of the memory array MA. The memory cell MC comprises a floating gate transistor FGT and a MOS type selection transistor TS. The gate of the selection transistor TS is controlled by the row decoder RDEC by the intermediary of a word line WL, the drain of the transistor is linked to a bit line BL, and its source is linked to the drain of the floating gate transistor FGT. The source of the transistor FGT is linked to a source line SL and its control gate terminal is linked to a control gate latch CGLT by the intermediary of a control gate transistor CGT and a control gate line CG, the gate of the transistor CGT being connected to the word line WL.

The memory array MA comprises groups of memory cells MC forming an ensemble of individually erasable and programmable words (not shown), each memory cell receiving one bit. Each group of memory cells forming one word is erase controlled by a control gate transistor CGT and a latch CGLT. Each bit line BL is connected to the output of a program latch PLT. The bit lines BL are also linked to the sense amplifiers SA by the intermediary of the group CT of column selection transistors. The decoders RDEC, CDEC are linked to the control circuit CCT2 by the intermediary of an address bus AB and receive respectively a row address RAD and a column address CAD forming the address of a word in the memory array. The decoder CDEC supplies column selection signals CSEL to the group CT of column selection transistors as well as to the control gate latches CGLT and to the program latches PLT. The program latches PLT and the sense amplifiers SA are linked to the control circuit CCT2 by the intermediary of a data bus DB. Data DIN to write in the memory array are saved in program latches selected by the decoder CDEC by means of the signals CSEL. During reading, bit lines BL are linked to the sense amplifiers SA by the intermediary of the group CT of transistors selected by the decoder CDEC by means of the signals CSEL. Data DOUT are read in the memory cells by the sense amplifiers SA and are supplied upon the bus DB. Finally, a control bus CB links the circuit CCT2 to these different elements, to control the erase, program, and read operations of the memory array.

In this implementation example of the memory MEM2, certain elements, such as the sense amplifiers SA, only require the voltage Vdd to operate and are therefore linked to the supply node N1. Other elements require the voltage Vdd and the voltage Vpp and are linked to the supply node N2. For example, the row decoders RDEC and column decoders CDEC use the voltage Vdd for the selection of memory cells during the read mode, then the voltage Vpp for erasing or programming of the memory cells. The latches CGLT use the voltage Vdd to select the column containing the word to be erased or to be programmed (target zone), then the voltage Vpp to erase the word. The latches PLT use the voltage Vdd to receive the data DIN to write, then the voltage Vpp to program these data in the memory cells selected by the decoders RDEC, CDEC.

Finally, it will be noted that the various elements of the memory, with the exception of the memory array, may be in practice integrated in the control circuit CCT2, the memory itself being essentially formed by the memory array MA. Thus, the supply node N2 of the memory, receiving the voltage Vpp, could also be a supply node of the control circuit CCT2.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic system, comprising:
   an integrated memory circuit implemented on a semiconductor chip, the memory circuit including:
      a first terminal configured to receive a supply voltage from off of the chip;
      a second terminal configured to receive from off of the chip at least one of a data signal and a clock signal; and
      a memory configured to receive the supply voltage and to be modified electrically by a modify voltage greater than the supply voltage, and
   a data bus coupled to the integrated memory circuit configured to apply the modify voltage to the integrated memory circuit via at least one of the first and second terminals.

2. An electronic system according to claim 1, comprising a voltage management device coupled to the data bus and configured to:
   monitor communications upon the data bus and detect that a write command is directed to the integrated memory circuit, and
   apply the modify voltage on the data bus in response to detecting the write command.

3. An electronic system according to claim 2, wherein the voltage management device includes:
   an input terminal configured to receive the data signal;
   an output terminal coupled to the data bus; and
   a switch having a first terminal coupled to the input terminal, a second terminal coupled to the output terminal, a third terminal configured to receive the modify voltage, the switch being configured to selectively couple the first and second terminals together to provide the data signal to the output terminal and selectively couple the second and third terminals together to provide the monitor voltage to the output terminal.

4. An electronic system according to claim 3, wherein the voltage management device includes:
   a charge pump configured to output a boosted voltage; and
   a sequencer circuit configured to produce the modify voltage from the boosted circuit, the sequencer circuit having an output coupled to the third terminal of the switch.

5. An electronic system according to claim 3, wherein the voltage management device includes a control circuit configured to detect the write command on the data signal and, in response to detecting the write command, cause the switch to couple the second and third terminals of the switch to each other.

6. An electronic system according to claim 2, wherein the voltage management device includes:
   a terminal coupled to the data bus; and
   a switch having a first terminal coupled to the terminal of the voltage management device and a second terminal configured to receive the modify voltage, the switch being configured to selectively couple the first and second terminals together to provide the modify voltage to the data bus.

7. An electronic system according to claim 6, wherein the voltage management device includes:
   a charge pump configured to output a boosted voltage; and
   a sequencer circuit configured to produce the modify voltage from the boosted circuit, the sequencer circuit having an output coupled to the second terminal of the switch.

8. An electronic system according to claim 6, wherein the voltage management device includes a control circuit coupled to the terminal of the voltage management device and configured to detect the write command at the terminal of the voltage management device and, in response to detecting the write command, cause the switch to couple the first and second terminals of the switch to each other.

9. A method, comprising:
   writing data in an integrated memory circuit implemented in a semiconductor chip and electrically powered by a supply voltage, the integrated memory circuit including a memory modifiable electrically by a modify voltage greater than the supply voltage, and a terminal configured to receive at least one of the supply voltage, a data signal, and a clock signal, the writing including:
      applying a write command to the integrated memory circuit; and
      supplying the modify voltage to the terminal of the integrated memory circuit.

10. A method according to claim 9, wherein:
    the applying includes applying the write command to the integrated memory circuit from data bus, and
    the supplying includes supplying the modify voltage to the terminal of the integrated memory circuit from a wire of the data bus.

11. A method according to claim 10, wherein the applying includes applying the write command to the integrated circuit from a master circuit coupled to the data bus, the method further comprising:
    detecting the write command using a voltage management device coupled to the data bus, the voltage management device being distinct from the master circuit and configured to monitor data traveling on the data bus, and
    applying the modify voltage to the wire of the data bus by the voltage management device.

12. An electronic system, comprising:
    an integrated memory circuit implemented on a semiconductor chip, the integrated memory circuit including:
       a first terminal configured to receive a supply voltage from off of the chip;
       a second terminal configured to receive from off of the chip at least one of a data signal and a clock signal; and
       a memory configured to receive the supply voltage and to be modified electrically by a modify voltage greater than the supply voltage; and
    a voltage management device coupled to a data bus and configured to:
       monitor communications upon the data bus and detect that a write command is directed to the integrated memory circuit, and
       transmit the modify voltage to the first integrated memory device in response to detecting the write command.

13. An electronic system according to claim 12, wherein the voltage management device includes:
    an input terminal configured to receive the data signal;
    an output terminal coupled to the first integrated memory device; and
    a switch having a first terminal coupled to the input terminal, a second terminal coupled to the output terminal, a third terminal configured to receive the modify voltage, the switch being configured to selectively couple the first and second terminals together to provide the data signal to the output terminal and selectively couple the second and third terminals together to provide the monitor voltage to the output terminal.

14. An electronic system according to claim 13, wherein the voltage management device includes:
    a charge pump configured to output a boosted voltage; and
    a sequencer circuit configured to produce the modify voltage from the boosted circuit, the sequencer circuit having an output coupled to the third terminal of the switch.

15. An electronic system according to claim 3, wherein the voltage management device includes a control circuit configured to detect the write command on the data signal and, in response to detecting the write command, cause the switch to couple the second and third terminals of the switch to each other.

16. An electronic system according to claim 12, wherein the voltage management device includes:
    a terminal coupled to the data bus; and
    a switch having a first terminal coupled to the terminal of the voltage management device and a second terminal configured to receive the modify voltage, the switch being configured to selectively couple the first and second terminals together to provide the modify voltage to the first integrated memory device via the data bus.

17. An electronic system according to claim 16, wherein the voltage management device includes:
    a charge pump configured to output a boosted voltage; and
    a sequencer circuit configured to produce the modify voltage from the boosted circuit, the sequencer circuit having an output coupled to the second terminal of the switch.

18. An electronic system according to claim 16, wherein the voltage management device includes a control circuit coupled to the terminal of the voltage management device and configured to detect the write command at the terminal of the voltage management device and, in response to detecting the write command, cause the switch to couple the first and second terminals of the switch to each other.

* * * * *